United States Patent [19]

Lee

[11] Patent Number: 4,906,839
[45] Date of Patent: Mar. 6, 1990

[54] HYBRID SURFACE EMITTING LASER AND DETECTOR

[75] Inventor: Wai-Hon Lee, Cupertino, Calif.

[73] Assignee: Pencom International Corp., Sunnyvale, Calif.

[21] Appl. No.: 213,647

[22] Filed: Jun. 30, 1988

Related U.S. Application Data

[63] Continuation-in-part of Ser. No. 858,411, May 1, 1986, Pat. No. 4,757,197.

[51] Int. Cl.⁴ .................................................. H01J 5/02
[52] U.S. Cl. ................................ 250/239; 250/211 J; 357/19
[58] Field of Search ................ 250/211 R, 211 J, 239, 250/216, 551; 357/19

[56] References Cited

U.S. PATENT DOCUMENTS

| | | | |
|---|---|---|---|
| 4,733,067 | 3/1988 | Oinoue et al. | 250/211 J |
| 4,736,231 | 4/1988 | Ayabe et al. | 357/19 |
| 4,764,931 | 8/1988 | Matsuda | 357/19 |
| 4,772,784 | 9/1988 | Yoshitosh et al. | 250/211 J |

*Primary Examiner*—David C. Nelms
*Attorney, Agent, or Firm*—Townsend and Townsend

[57] ABSTRACT

The present invention is a combined surface emitting semiconductor laser and photodetector in a single housing with the photodetector positioned to detect light emitted from the surface emitting laser and reflected off of a medium. The surface emitting laser is mounted on the top surface of a chip which includes at least one set of two photodetectors for detecting a reflected beam. At least two photodetectors are used so that spacial variations in the reflected beam can be detected for focusing and tracking when the device is used in an optical head. Photodetectors are arranged to intersect a diffracted beam from a hologram lens used in an optical head. A rear emission photodetector for monitoring the power of the surface emitting laser is positioned so that it will not receive diffracted light which will interfere with its operation.

9 Claims, 4 Drawing Sheets

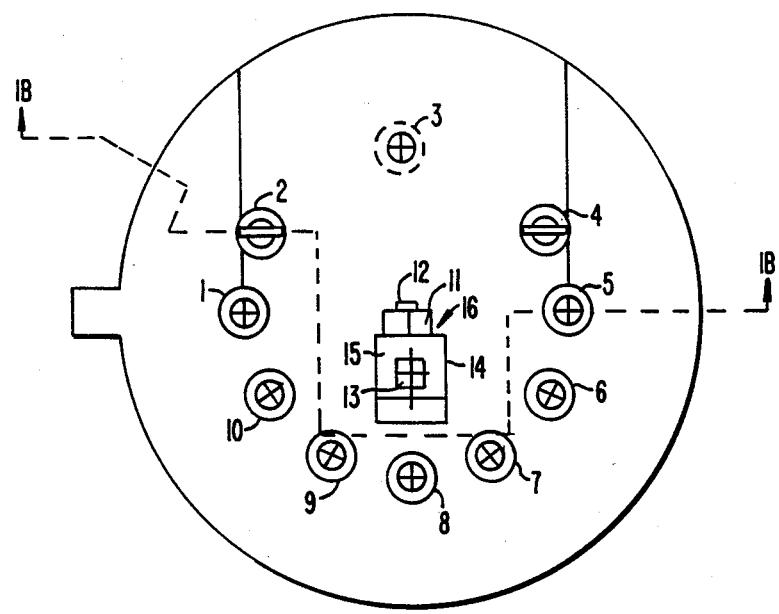
FIG._1A.
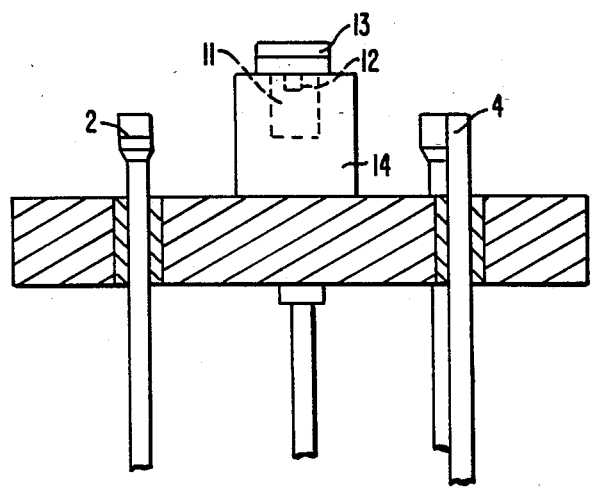
FIG._1B.

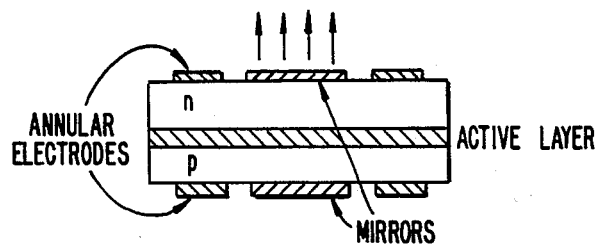
FIG._2A. PRIOR ART
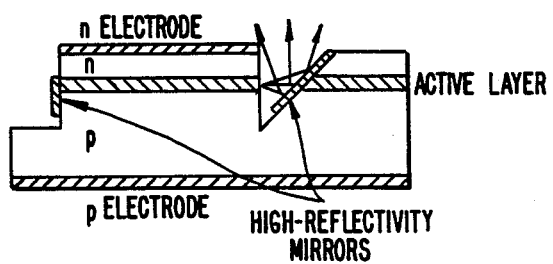
FIG._2B. PRIOR ART
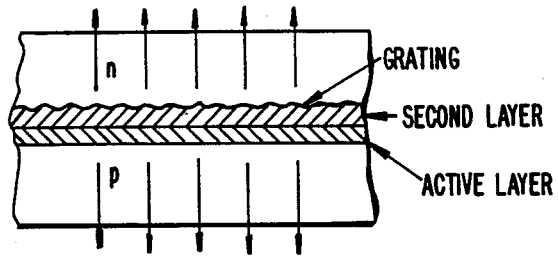
FIG._2C. PRIOR ART

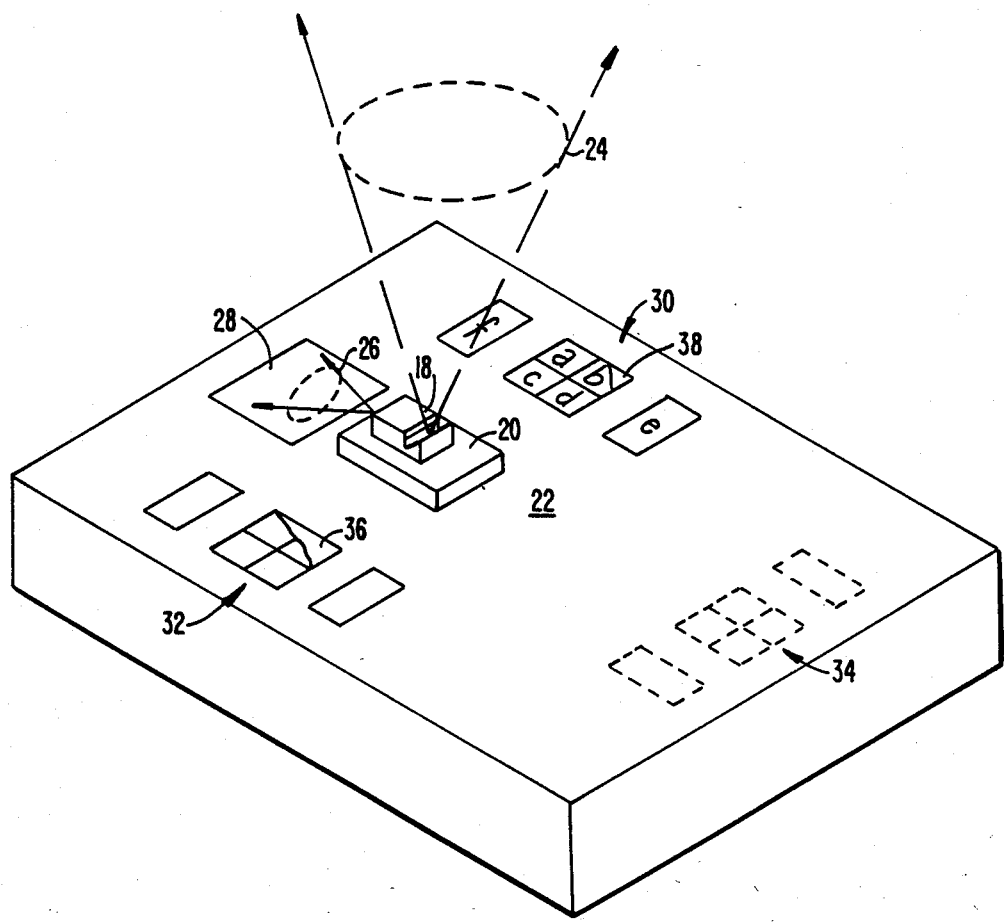
FIG._3.

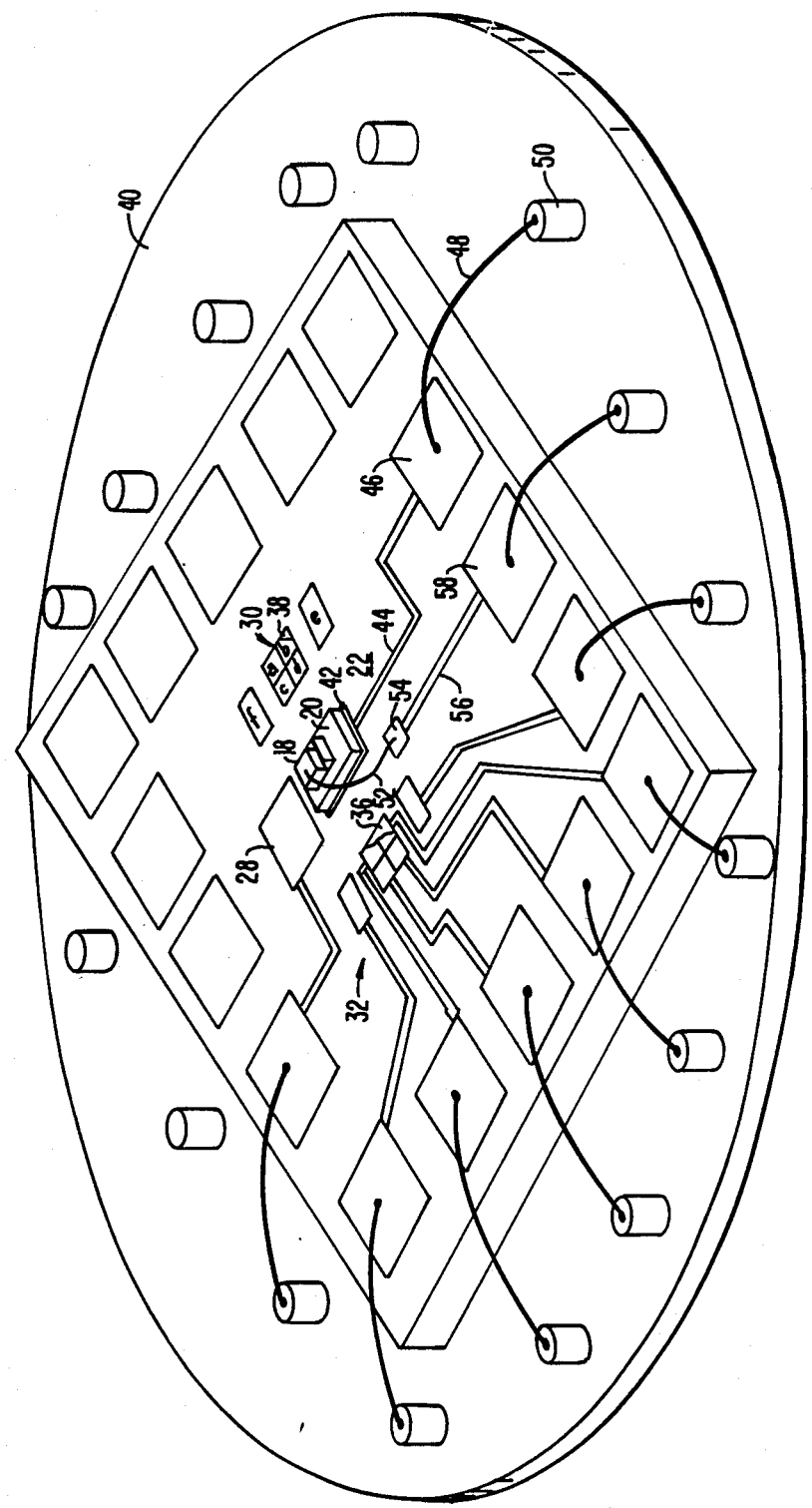
FIG._4.

HYBRID SURFACE EMITTING LASER AND DETECTOR

This is a continuation-in-part of application Ser. No. 858,411 filed May 1, 1986, now U.S. Pat. No. 4,757,197.

BACKGROUND

The present invention relates to semiconductor lasers and detectors for detecting light from a semiconductor laser.

A semiconductor laser is a device which emits light of substantially a single wavelength. The light from this type of laser can be focused to a spot with a diameter comparable to its wavelength. The semiconductor laser belongs to the same family of semiconductor devices as the LED (light emitting diode). However, the light from an LED has a broader spectrum of wavelengths and thus cannot be focused as sharply as a semiconductor laser. The structure and composition of the laser determine its wavelength, its expected lifetime and its light guiding mechanism. Examples of laser structures are gain guided lasers and index guided lasers. Examples of laser structures are shown in U.S. Pat. Nos. 3,479,613, 3,457,468, 3,293,513, 3,257,626, and 4,483,480.

Most commercial semiconductor lasers contain a photodetector behind the lasing structure to monitor the level of light emitted at the front of the laser chip. The monitoring photodetector provides a signal which is used to maintain a constant laser output. It has been noted in some applications that when a small amount of light emitted from the laser is fed back into the laser chip, it causes a change in the laser output power which can be detected by the rear photodetector. Otherwise, most applications use a separate photodetector to monitor light reflected off of an object by a laser. This light is typically supplied to the separate photodetector through a beam splitter or other device.

The light emitted from a standard laser diode comes from an edge of the laser chip, and thus is emitted parallel to a top surface of the semiconductor chip. The parent patent application referenced above showed a semiconductor laser and photodetector mounted within a single housing. FIG. 1A shows a top view of such a hybrid device. A number of connector pins 1–10 are shown which extend through the bottom of the container. A laser diode chip 12 is bonded to a silicon substrate 11 which is in turn bonded to a first, side surface 16 of a heat sink 14. A four quadrant photodetector 13 is bonded to a second, top surface 15 of heat sink 14. The light emitted by laser diode 12 comes out of the page in FIG. 1A, is reflected off of a medium and directed back to photodetector 13.

FIG. 1B shows a side view of the hybrid device in FIG. 1A. During manufacturing, laser chip 12 is provided with wire bonding connections to pins 2 and 4 with a device in the orientation shown in FIG. 1B. The device is then rotated by 90 degrees to the orientation in FIG. 1A to connect the four quadrant photodetector to the remaining pins.

A recent advance in semiconductor laser diodes is the development of a surface emitting laser. FIGS. 2A, 2B and 2C show three embodiments of such surface emitting lasers. In each case, the laser light is emitted from a top surface of the semiconductor laser diode, rather than a side or edge surface. In the embodiment of FIG. 2B, for example, this is done by cutting a notch in the device and using a reflective mirror to direct upward the light being emitted to a side. Such surface emitting lasers are discussed in an article entitled "R & D on Surface-Emitting Diode Lasers", James N. Walpole, Laser Focus/Electro-Optics, Page 66–70 (September, 1987).

SUMMARY OF THE INVENTION

The present invention is a combined surface emitting semiconductor laser and photodetector in a single housing with the photodetector positioned to detect light emitted from the surface emitting laser and reflected off of a medium. The surface emitting laser is mounted on the top surface of a chip which includes at least one set of two photodetectors for detecting a reflected beam. At least two photodetectors are used so that spacial variations in the reflected beam can be detected for focusing and tracking when the device is used in an optical head. Photodetectors are arranged to intersect a diffracted beam from a hologram lens used in an optical head. A rear emission photodetector for monitoring the power of the surface emitting laser is positioned so that it will not receive diffracted light which will interfere with its operation.

In a preferred embodiment, a gallium arsenide surface emitting laser is mounted on an intermediate silicon substrate which in turn is mounted on a silicon chip containing the photodetector. A single, rear emission detector is located behind the surface emitting laser with a pair of four quadrant photodetectors being mounted on the two sides of the surface emitting laser. Alternately, at least one four quadrant photodetector may be mounted in front of the surface omitting laser but at a different distance than the rear emission detector. The detectors are mounted at different distances so that the mirror image of the diffracted beam hitting the four quadrant photodetector does not hit the rear emission detector. The rear emission detector must be located closer so that it can accurately monitor the energy of the laser from its rear emission which would disperse rapidly.

The present invention not only allows the manufacture of a laser diode and detector on a single chip, but simplifies the manufacturing process since the chip can be held in one orientation for the attaching of all bonding wires. The surface emitting laser is mounted on the detector chip, in contrast to the parent application where the detector is mounted on the laser heat sink. The present invention is preferably used in an optical head such as the one disclosed in U.S. Pat. No. 4,731,772.

For a fuller understanding of the nature and advantages of the invention, reference should be made to the ensuing detailed description taken in conjunction with the accompanying drawings.

BRIEF DESCRIPTION OF THE DRAWINGS

FIG. 1A is a top, sectional view of a hybrid semiconductor laser and photodetector as set forth in the parent application;

FIG. 1B is a side, sectional view of the embodiment of FIG. 1A;

FIGS. 2A, 2B and 2C are diagrams of different embodiments of surface emitting lasers according to the prior art;

FIG. 3 is a perspective view of a hybrid surface emitting laser and photodetector device according to the present invention; and FIG. 4 is a perspective view of the device of FIG. 3 mounted in a can.

DETAILED DESCRIPTION OF THE PREFERRED EMBODIMENTS

FIG. 3 shows a hybrid surface emitting laser and photodetector device according to the present invention. A surface emitting laser 18 is shown mounted on an intermediate silicon substrate 20 which is in turn mounted on a top surface 22 of a silicon substrate. The surface emitting laser 18 is the type shown in FIG. 2B, but could be any other type of surface emitting laser as well. The light emitted by the laser is shown as a cone 24 directed upward from surface 22. A rear emission cone 26 is intersected by a rear emission photodetector 28 which is a light sensitive area of the top surface 22 of the silicon substrate.

A pair of photodetectors 30 and 32 for detection of reflected light are shown. An alternate position for placement of such a photodetector is shown in phantom as a photodetector 34. Photodetectors 30 and 32 are located on opposite sides of surface emitting laser 18 so that they can intersect the first order diffracted beams from a hologram lens directing a reflected beam. These photodetectors are positioned at 90 degrees to rear emission detector 28 so that none of the reflected, diffracted beams interferes with the rear emissions detected by detector 28. Similarly, the position of alternate photodetector 34 is farther from the surface emitting laser 18 than rear detector 28 so that the mirror image of the diffracted beam hitting photodetector 34 will not hit detector 28.

Each of photodetectors 30, 32 and 34 is shown as a four quadrant photodetector with additional photodetectors on each side of the four quadrant detector. The four quadrants, a, b, c and d are used to enable detection of spacial variations and a reflected beam in a well known manner. This allows for focus and error tracking by monitoring an astigmatic reflected beam. Additional photodetectors f and e are used for applications in which separate detectors are needed for tracking, where three reflected beams are used.

By utilizing differential detection with a four quadrant photodetector (or another arrangement of a plurality of photodetectors), the signal of interest is the difference between the signals detected by the four photodetectors. This difference signal is further normalized by a sum signal from the four quadrants. For example, if a, b, c and d are signals from each quadrant, the signal of interest is:

$$\frac{[(a+b)-(c+d)]}{a+b+c+d}$$

or: $\frac{(a+d)-(b+c)}{a+b+c+d}$

Thus, the photodetector is not sensitive to variations in gain caused by temperature variations by virtue of mounting the laser diode on the same heat sink as the photodetectors. The use of the four quadrant photodetector enables this embodiment of the present invention to combine the laser diode and the four quadrant photodetector on the same heat sink.

As can be seen, wire bonds can be attached to the photodetectors and the surface emitting laser on the same surface with the semiconductor chip in the same orientation, thus simplifying the manufacturing process. By mounting the laser and detectors on the same chips, vibration errors are reduced since both vibrate the same amount.

Isolating silicon substrate 20 serves to elevate the surface emitting laser 18 above the detector surface, providing needed spacial separation for a holographic optical head to produce and astigmatic reflected beam. The structure of the present invention allows the photodetectors to be placed very close to the surface emitting laser. This reduces the sensitivity of the device to variations in the wavelength of the laser. A percentage change in the wavelength of the laser results in a corresponding percentage change in the position where the reflected beam impacts. This corresponding percentage change is a percentage of the distance between the laser and the detector. By minimizing this distance, although the percentage change remains the same, the absolute change becomes smaller, thus making the device less sensitive to changes in wavelength.

FIG. 4 shows the device of FIG. 3 mounted in a can 40. Only a portion of the metal connections have been shown for simplicity. For instance, the individual photodetectors of detector 30 would be coupled in parallel with the detectors of detector 32. In addition, only one connection is shown in each of the detector elements.

Silicon substrate 20, which supports surface emitting laser 18, is mounted on a metal pad 42 which is coupled by a metalization line 44 to a bonding pad 46. Bonding pad 46 is in turn coupled with bonding wire 48 to a pin 50. The top of surface emitting laser 18 is coupled with a wire 52 to a pad 54 which is coupled via a metalization line 56 to a bonding pad 58. Similar metalization line connections to the bonding pads for the detectors are also shown. As can be seen, all of the bonding wires can be attached with the chip in the same orientation.

The surface emitting laser of the type shown in FIG. 2B is preferable, because it produces a cone of light, which is more susceptible to manipulation by a holographic lens than the parallel light emitted by the embodiments of FIGS. 2A and 2C.

Preferably, detectors 30 and 32 are mounted on opposite sides of surface emitting laser 18 so that both diffracted beams will be intersected, thus increasing the sensitivity of the detection.

Polarizers 36 and 38, shown partially broken away over detectors 30 and 32, can be used for thermal magnetic recording. Thermal magnetic recording provides an erasing and rewriting capability. The principle of thermal magnetic recording is based on a characteristic of certain ferromagnetic materials. When the temperature of the material is raised above the Currie temperature, the magnetization of the material can be affected by a small magnetic field. This principle is used for thermal magneto-optics data storage where a laser beam is focused on the recording medium to raise the temperature of the medium above the Currie temperature. A small electro-magnet is placed on the other side of the medium to create a magnetic field near the medium to change the magnetization of the medium. To retrieve information from the medium a laser beam is again focused on the medium but at lower power. Depending on the magnetization of the medium, the polarization of the beam reflected off the medium is either unchanged or rotated by about 0.4 degree. An analyzer (polarizer) inserted before a photodetector allows the detector to sense these two different states of polarization of the returned beam. One method of erasing the recorded information is to first reverse the direction of magnetization of the electro-magnet and then apply a focused laser beam to raise the temperature of the medium to above the Currie temperature to uniformly magnetize the medium in one direction.

To use the above principle in optical data storage systems an optical head is needed to produce a focused laser beam on the thermal magnetic medium. Moreover, a polarizer is needed to permit the detector to read the information recorded on the medium.

Polarizers needed for the thermal magnetic optical heads are available commercially in two forms. One is a sheet type polarizer based on dichroism, which is the selective absorption of one plane of polarization in preference to the other orthogonal polarization during transmission through a material. Sheet polarizers are manufactured from organic materials which have been imbedded into a plastic sheet. The sheet is stretched, thereby aligning the molecules and causing them to be birefringent, and then dyed with a pigment. The dye molecules selectively attach themselves to the aligned polymer molecules, with the result that absorption is verY high in one plane and relatively weak in the other. The transmitted light is then linearaly polarized.

Another type of polarizer is based on the use of wire grid structures to separate the two orthogonal polarizations. When light radiation is incident on an array of parallel reflective stripes whose spacing is on the order of our less than the wavelength of the radiation, the radiation whose electric vector is perpendicular to the direction of the array is reflected. The result is that the transmitted radiation is largely linerally polarized.

As will be understood by those familiar with the art, the present invention may be embodied in other specific forms without departing from the spirit or essential characteristics thereof. For example, a pair of photodetectors or three photodetectors could be used in place of the four quadrant photodetector shown in the figures. Alternately, a matching photodetector opposite photodetector 34 could be used. Accordingly, the disclosure of the preferred embodiments of the present invention is intended to be illustrative, but not limiting, of the scope of the invention which is set forth in the following claims.

What is claimed is:

1. A hybrid laser and photodetector device mounted on a top surface of a semiconductor chip for use in a holographic optical head, comprising:
   a surface emitting semiconductor laser mounted on said top surface of said semiconductor chip for directly emitting a laser beam orthogonal to said top surface;
   an emission photodetector located on said top surface adjacent said surface emitting laser for monitoring a power output of said surface emitting laser; and
   at least two photodetectors for enabling the sensing of the shape of a reflected, diffracted beam of a beam emitted by said surface emitting laser from the difference in the amount of said reflected laser beam detected by each of said two detectors, said two photodetectors being located on said top surface at an angle to a line between said surface emitting laser and said emission photodetector, such that a diffracted reflected beam from said holographic optical head does not interfere with said emission photodetector.

2. The hybrid laser and photodetector of claim 1 wherein said at least two photodetectors comprises a pair of four quadrant photodetectors located on opposite sides of said surface emitting laser, with a line between each of said four quadrant photodetectors and said surface emitting laser being at an angle of 90 degrees to a line between said surface emitting laser and said emission photodetector.

3. The hybrid laser and photodetector of claim 1 wherein said at least two photodetectors are located on an opposite side of said surface emitting laser from said emission photodetector at a greater distance from said surface emitting laser than said emission photodetector.

4. The hybrid laser and photodetector of claim 1 wherein said photodetectors are formed in silicon and said surface emitting semiconductor laser is formed in gallium arsenide.

5. The hybrid laser and photodetector of claim 1 further comprising an intermediate layer of silicon between said surface emitting semiconductor laser and said top surface of said semiconductor chip.

6. The hybrid laser and photodetector of claim 1 wherein said at least two photodetectors comprises a four quadrant photodetector with additional photodetectors on either side of said four quadrant photodetector for enabling three-beam tracking.

7. The hybrid laser and photodetector of claim 1 further comprising a polarizer mounted over at least a portion of said at least two photodetectors.

8. A hybrid laser and photodetector device mounted on a top surface of a silicon semiconductor chip for use in a holographic optical head, comprising:
   a gallium arsenide surface emitting semiconductor laser mounted on said top surface of said semiconductor chip for directly emitting a laser beam orthogonal to said top surface;
   an intermediate layer of silicon between said surface emitting semiconductor laser and said top surface of said semiconductor chip;
   an emission photodetector located on said top surface adjacent said surface emitting laser for monitoring a power output of said surface emitting laser; and
   a pair of four quadrant photodetectors for enabling the sensing of the shape of a reflected, diffracted beam of a beam emitted by said surface emitting laser from the difference in the amount of said reflected laser beam detected by each of said detectors, said pair of four quadrant photodetectors being located on opposite sides of said surface emitting laser, with each of said four quadrant photodetectors being at an angle of approximately 90 degrees to a line between said surface emitting laser and said emission photodetector.

9. The hybrid laser and photodetector of claim 8 further comprising a polarizer mounted over said four quadrant photodetectors.

* * * * *